(12) United States Patent
Le et al.

(10) Patent No.: US 6,215,351 B1
(45) Date of Patent: Apr. 10, 2001

(54) FUSE-LATCH CIRCUIT

(75) Inventors: Thoai-Thai Le; Helmut Schneider, both of München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/321,174

(22) Filed: May 27, 1999

(30) Foreign Application Priority Data

May 27, 1998 (DE) .............................................. 198 23 687

(51) Int. Cl.[7] .......................... H01H 37/76; H01H 85/00
(52) U.S. Cl. ....................................... 327/525; 365/225.7
(58) Field of Search .......................... 327/525; 365/225.7

(56) References Cited

U.S. PATENT DOCUMENTS

| 5,566,107 | 10/1996 | Gilliam | 365/200 |
| 5,619,469 | 4/1997 | Joo | 365/225.7 |
| 5,640,365 | * 6/1997 | Imamiya et al. | 365/236 |
| 5,680,360 | 10/1997 | Pilling et al. | 365/225.7 |

FOREIGN PATENT DOCUMENTS

19631130A1   2/1998   (DE) .

* cited by examiner

Primary Examiner—Terry D. Cunningham
Assistant Examiner—Quan Tra
(74) Attorney, Agent, or Firm—Herbert L. Lerner; Laurence A. Greenberg; Werner H. Stemer

(57) ABSTRACT

A fuse-latch circuit in which, by use of a first and a second control signal, which are staggered over time with respect to one another, fuse information can be read from a fuse into a latch element and can be stored in the latch element. Both control signals are in this case obtained from only one global signal by a delay element.

6 Claims, 1 Drawing Sheet

FUSE-LATCH CIRCUIT

BACKGROUND OF THE INVENTION

1. Field of the Invention

Figure 1:
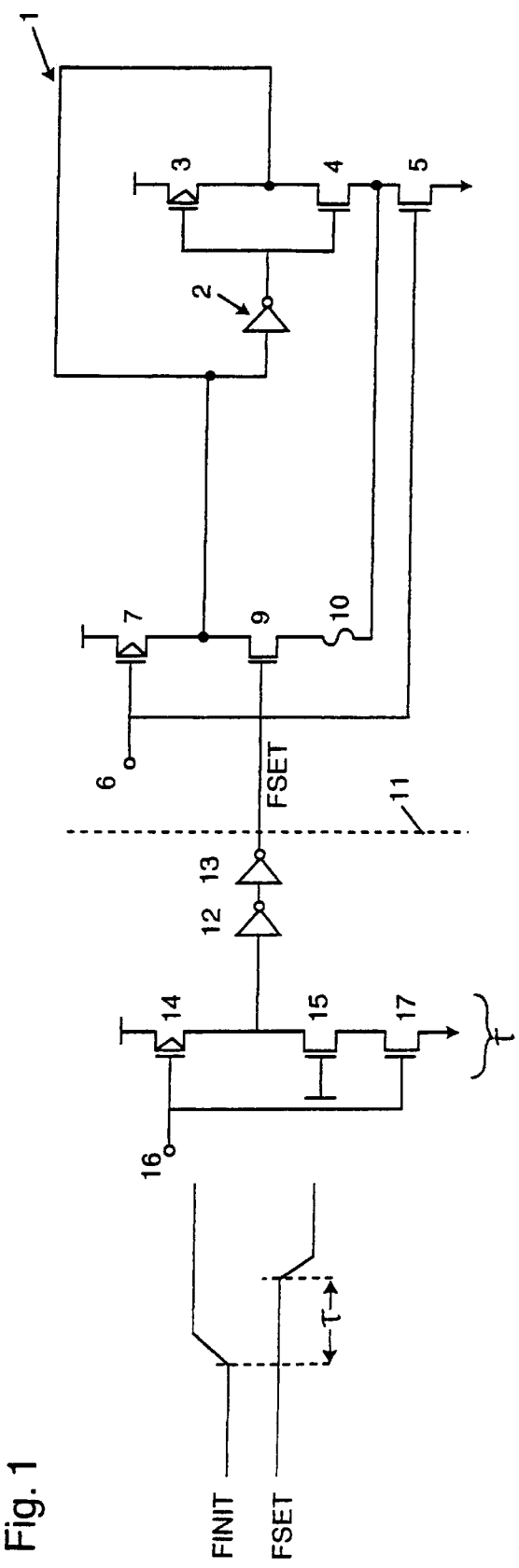

The present invention relates to a fuse-latch circuit in which, by a first and a second control signal, which are staggered over time with respect to one another, fuse information (i.e. fuse is defective or intact) can be read from a fuse into a latch element and can be stored in the latter.

In a fuse-latch circuit, it ought to be possible to store fuse information for the operation of a semiconductor component, for example of a semiconductor memory, after the fuse information has been read from the fuse in the event of the supply voltage being switched on.

2. Summary of the Invention

It is accordingly an object of the invention to provide a fuse-latch circuit which overcomes the above-mentioned disadvantages of the prior art devices of this general type, which manages with only one global control signal in order to reduce the outlay on global wiring and to preclude the occurrence of propagation delay problems between the global control signals with respect to one another.

With the foregoing and other objects in view there is provided, in accordance with the invention, a fuse-latch circuit for a fuse, including:

a first MOS transistor having a source-drain path and formed of a conductivity type;

a second MOS transistor having a source-drain path and formed of a conductivity type that is the same as the first MOS transistor, and a fuse is to be disposed between the source-drain path of the first MOS transistor and the source-drain path of the second MOS transistor;

a latch element connected to the second MOS transistor; and a delay element connected to the first MOS transistor, the delay element receiving only one first global initialization control signal and generating a second local control signal being staggered over time with respect to the first global initialization control signal, the first global initialization control signal and the second local control signal used for reading information corresponding to a state of the fuse and the information read from the fuse being stored in the latch element.

In the case of a fuse-latch circuit of the type mentioned in the introduction, the object is achieved according to the invention by virtue of the fact that, in addition to the first control signal, the second control signal is also obtained from a global initialization signal by the delay element.

In the fuse-latch circuit according to the invention, therefore, two essential further measures are employed in addition to the existing circuit:

(a) One of the control signals is obtained from the other, global control signal by the time delay, for which purpose inverters can advantageously be used.

(b) The fuse is connected to ground only after initialization via a switch, for example an NMOS transistor, in order to prevent a parallel-path current, which will be present in the case of an intact fuse, during initialization.

Other features which are considered as characteristic for the invention are set forth in the appended claims.

Although the invention is illustrated and described herein as embodied in a fuse-latch circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTIONS OF THE DRAWINGS

Figure 2:
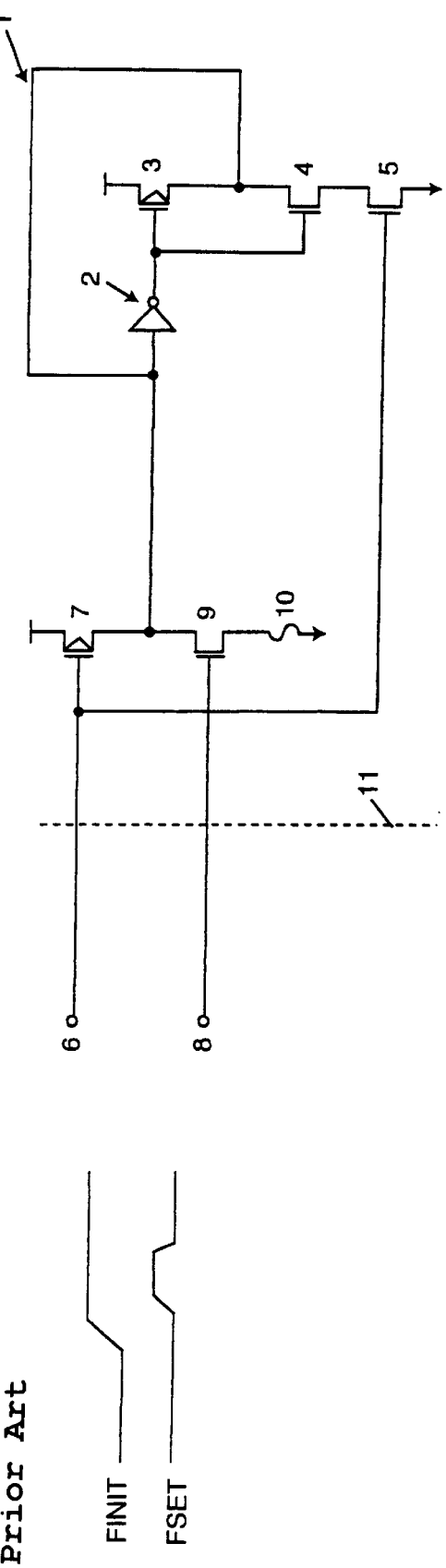

FIG. 1 is a diagrammatic, circuit diagram for elucidating a fuse-latch circuit according to the invention; and FIG. 2 is a circuit diagram for elucidating the fuse-latch circuit according to the prior art.

DESCRIPTION OF THE PREFERRED EMBODIMENTS

In all the figures of the drawing, sub-features and integral parts that correspond to one another bear the same reference symbol in each case. Referring now to the figures of the drawings in detail and first, particularly, to FIG. 2 thereof, there is shown a prior art fuse-latch circuit containing a latch storage element 1 with a first inverter 2, and a second inverter formed of a p-channel MOS transistor 3 and an n-channel MOS transistor 4. The transistors 3, 4 are connected in series with an n-channel MOS transistor 5, whose source is connected to ground. Gates of the MOS transistors 3, 4 are connected together and connected to an output of the inverter 2. In addition, an input of the inverter 2 is connected to a node between the transistors 3, 4.

A fuse initialization signal FINIT having the profile shown in FIG. 2 is fed to an input terminal 6 and is present at a gate of a p-channel MOS transistor 7 and at a gate of the n-channel MOS transistor 5. In addition, a fuse set signal FSET is fed to an input terminal 8, which is connected to a gate of an n-channel MOS transistor 9. The transistors 7 and 9 are connected in series with a fuse 10 and with a supply voltage.

In the event of initialization of the fuse-latch circuit, first of all the initialization signal FINIT is fed to the input terminal 6, as a result of which, as soon as this signal becomes "high" (logic "1"), the transistor 5 turns on, whereas the transistor 7 turns off. The transistor 9 is still turned off at this point in time. Once the fuse set signal FSET at the input terminal 8 becomes high, the transistor 9 turns on, with the result that the fuse information of the fuse 10 can be written to the latch element 1. After the fuse set signal FSET has fallen again, the transistor 9 turns off, with the result that the information remains written in the latch element 1.

The existing fuse-latch circuit of FIG. 2 necessarily requires two global control signals, namely the signals FINIT and FSET, which requires a considerable outlay on global wiring and, in addition, makes it difficult to prevent propagation delay problems of the two global control signals with respect to one another during distribution across a chip.

In the fuse-latch circuit 1 as shown in FIG. 1 and according to the invention, provision is made, in addition to the existing circuit of a delay element containing a p-channel MOS transistor 14, an n-channel MOS transistor 15 and an n-channel MOS transistor 17 (see in particular, the section situated to the left of dashed lines 11). The transistors 14, 15 and 17 are connected in series between ground and a supply voltage. The fuse initialization signal FINIT is fed to an input terminal 16 as well as to the input terminal 6, from which fuse initialization signal a fuse set signal FSET is obtained with the aid of the delay element formed of the transistors 14, 15 and 17, the fuse set signal being fed to the gate of the transistor 9 (as in FIG. 2). In this case, the additional n-channel MOS transistor 15 effects a time delay t between the signals FINIT and FSET, i.e. a low-high edge of the signal FINIT and a high-low edge of the signal FSET.

During the initialization phase, the signal FINIT is set to logic "0" ("low"), as a result of which the transistor 7 is switched on and the latch element 1 is preinitialized with logic "1" ("high"). The signal FSET is at logic "1" during the initialization of the latch element 1. A parallel-path current through an intact fuse 10 is prevented by the transistor T5.

After the initialization, the signal FINIT changes from logic "0" ("low") to logic "1" ("high"). On account of the delay element, formed of the transistors T14, T15 and T17, the signal FSET remains at logic "1" for the duration t. Since the transistor T5 is switched on, the fuse information is written to the latch element 1 as follows:

(a) If the fuse 10 is intact, the input of the inverter 2 is pulled to logic "0", as a result of which the latch element 1 is reset.

(b) If, on the other hand, the fuse 10 is defective (e.g. bombarded by laser), then a logic "1" ("high") is stored in the latch element 1.

After the duration t, the signal FSET changes to low, as a result of which the transistor 9 is switched off and the fuse is decoupled from the latch element 1.

In contrast to the existing fuse-latch circuit of FIG. 2, the fuse 10 is connected between the transistor 9 and the node between the transistors 4 and 5 in the case of the fuse-latch circuit according to the invention. The effect achieved as a result of this is that no parallel-path current flows during initialization of the circuit in the case of intact fuses.

If appropriate, it is also possible for two inverters 12, 13 to be additionally provided for the purpose of delay, but there is not a need for this since the delay can actually be "built" into the transistors 14, 15, 17 on their own.

Thus, the invention enables the necessary control signals to be generated locally from only one global signal, with the result that it is possible to attain significant advantages in respect of the saving for the global wiring and the prevention of propagation delay problems of the global control signals with respect to one another during distribution across a chip.

We claim:

1. A fuse-latch circuit for a fuse, comprising:

a first MOS transistor having a source-drain path, a gate and formed of a first conductivity type;

a second MOS transistor having a source-drain path, a gate and formed of a said first conductivity type, and the fuse provided in series between said source-drain path of said first MOS transistor and said source-drain path of said second MOS transistor;

a third MOS transistor having a source-drain path, a gate and formed of a second conductivity type;

a latch element connected to said source-drain path of said second MOS transistor and to a node between said source-drain path of said first MOS transistor and said source-drain path of said third MOS transistor, said gate of said third MOS transistor being connected to said gate of said second MOS transistor and receiving only one first global initialization control signal; and a delay element connected to said gate said first MOS transistor, said delay element receiving the first global initialization control signal and generating a second local control signal being staggered over time with respect to the first global initialization control signal, the second local control signal being supplied to said gate of said first MOS transistor, and the first global initialization control signal and the second local control signal used for reading information corresponding to a state of the fuse and said information stored in said latch element.

2. The fuse-latch circuit according to claim 1, wherein said delay element is formed from transistors.

3. The fuse-latch circuit according to claim 2, including inverters connected between said delay element and said first MOS transistor for providing a delay.

4. A fuse-latch circuit, comprising:

a first MOS transistor having a source-drain path, a gate and formed of a first conductivity type;

a second MOS transistor having a source-drain path, a gate and formed of a said first conductivity type;

a fuse provided in series between said source-drain path of said first MOS transistor and said source-drain path of said second MOS transistor;

a third MOS transistor having a source-drain path, a gate and formed of a said second conductivity type;

a latch element connected to said source-drain path of said second MOS transistor and to a node between said source-drain path of said first MOS transistor and said source-drain path of said third MOS transistor, said gate of said third MOS transistor being connected to said gate of said second MOS transistor and receiving only one first global initialization control signal; and a delay element connected to said gate said first MOS transistor, said delay element receiving the first global initialization control signal and generating a second local control signal being staggered over time with respect to the first global initialization control signal, the second local control signal being supplied to said gate of said first MOS transistor, and the first global initialization control signal and the second local control signal used for reading information corresponding to a state of said fuse and said information stored in said latch element.

5. The fuse-latch circuit according to claim 4, wherein said delay element is formed from transistors.

6. The fuse-latch circuit according to claim 5, including inverters connected between said delay element and said first MOS transistor for providing a delay.

* * * * *